United States Patent [19]

Theodore et al.

[11] Patent Number: 5,326,971
[45] Date of Patent: Jul. 5, 1994

[54] TRANSMISSION ELECTRON MICROSCOPE ENVIRONMENTAL SPECIMEN HOLDER

[75] Inventors: N. David Theodore, Mesa; Juan P. Carrejo, Tempe, both of Ariz.

[73] Assignee: Motorola, Inc., Schaumburg, Ill.

[21] Appl. No.: 62,262

[22] Filed: May 17, 1993

[51] Int. Cl.⁵ .................. H01J 37/295; H01J 37/30
[52] U.S. Cl. .................. 250/311; 250/441.11; 250/492.2
[58] Field of Search .............. 250/311, 307, 441.11, 250/492.2

[56] References Cited

U.S. PATENT DOCUMENTS

| | | | |
|---|---|---|---|
| 3,206,598 | 9/1965 | Wegmann | 250/441.11 |
| 4,463,257 | 7/1984 | Simpkims et al. | 250/310 |
| 4,950,901 | 8/1990 | Jones et al. | 250/443.1 |
| 4,996,433 | 2/1991 | Jones et al. | 250/443.1 |
| 5,113,072 | 5/1992 | Yamaguchi et al. | 250/452.21 |
| 5,229,607 | 7/1993 | Matsui et al. | 250/310 |

*Primary Examiner*—Bruce C. Anderson
*Attorney, Agent, or Firm*—Michael D. Bingham; Michael Waters

[57] ABSTRACT

An environmental chamber for a transmission electron microscope, in which a specimen is held in position within the transmission electron microscope so an electron beam passes through the specimen to a detector. A removable sleeve surrounds the specimen holder and is sealed at both ends by a seal between the removable sleeve and the specimen holder to form a differential pressure chamber. Apertures are formed in the removable sleeve allowing the electron beam to pass through the specimen to the detector. A vacuum line allows gases to be removed from the differential chamber. A reactive inlet line extends into the differential chamber to allow a material to be introduced onto the specimen.

9 Claims, 1 Drawing Sheet

TRANSMISSION ELECTRON MICROSCOPE ENVIRONMENTAL SPECIMEN HOLDER

BACKGROUND OF THE INVENTION

The present invention relates, in general, to transmission electron microscope specimen holders, and more particularly to a transmission electron microscope specimen holder for study of chemical reactions.

The transmission electron microscope (TEM) is widely used for materials characterization. One aspect of materials characterization is the study of the composition and lattice structures of various materials. The transmission electron microscope allows very detailed studies of the structure of materials to be performed. To this end various specimen holders are known in the prior art: a single tilting mechanism which allows the specimen to be tilted about a single axis with respect to the electron beam, a double tilt holder which tilts about two perpendicular axes, heating holders which can heat the specimen up to approximately 1,000° C., and cooling holders which permit cooling of a specimen to the temperature of liquid nitrogen.

There is a need to study chemical reactions between solids and gases or between solids and liquids since these reactions are encountered in processing environments in almost any materials based industry. One such materials based industry is the semiconductor industry which depends on finely controlled chemical reactions and precisely controlled surface structures within a semiconductor wafer. Detailed study of chemical reactions involving gases or liquids is inherently difficult in an electron microscope since a high vacuum must be maintained in order for the electron beam to be adequately focused. For the lower resolution scanning electron microscope the equipment has been modified to permit a lowered vacuum in the vacuum column adjacent to the specimen. This approach is satisfactory for a scanning electron microscope due to the lower resolution and the fact that a scanning electron microscope only senses surface topography rather than internal structure.

There is a need for a specimen holder for a transmission electron microscope which will permit the study of chemical reactions involving gases and liquids interacting with the specimen. This holder should allow a relatively dense atmosphere close to the specimen and yet maintain a good enough vacuum in the microscope column so that the electron beam can be focused to obtain a high resolution. Ideally the specimen holder should be compatible with current transmission electron microscope equipment, and should allow modification of the holder or adjustment of the specimen without disassembling the entire transmission electron microscope.

SUMMARY OF THE INVENTION

An environmental chamber for a transmission electron microscope, in which a specimen is held in position within the transmission electron microscope such that an electron beam is directed through the specimen to a detector. A removable sleeve surrounds the specimen holder and is sealed at both ends by a seal between the removable sleeve and the specimen holder to form a differential pressure chamber. An aperture is formed in the removable sleeve allowing the electron beam to pass through the specimen to the detector. A vacuum line allows gases to be removed from the differential chamber. A reactive inlet line extends into the differential chamber in such a way as to allow a material to be introduced onto the specimen.

A method of fabricating an environmental chamber for a transmission electron microscope. The method includes providing a transmission electron microscope having a removable specimen holder. Holding a specimen in a predetermined position within the transmission electron microscope such that an electron beam is directed through the specimen to a detector. Surrounding the specimen holder with a removable sleeve. Sealing both ends of the removable sleeve to the specimen holder by means of O-rings in such a way as to form a differential vacuum chamber. Forming two apertures in the removable sleeve such that the electron beam passes through the two apertures. Filling the two apertures with a thin film of carbon material such that gaseous material is blocked but the electron beam is substantially undisturbed. Evacuating gases from the first differential chamber with a first vacuum line. Introducing material onto the specimen by a reactive inlet line which extends into the first differential chamber.

DETAILED DESCRIPTION OF THE DRAWINGS

Figure 1:
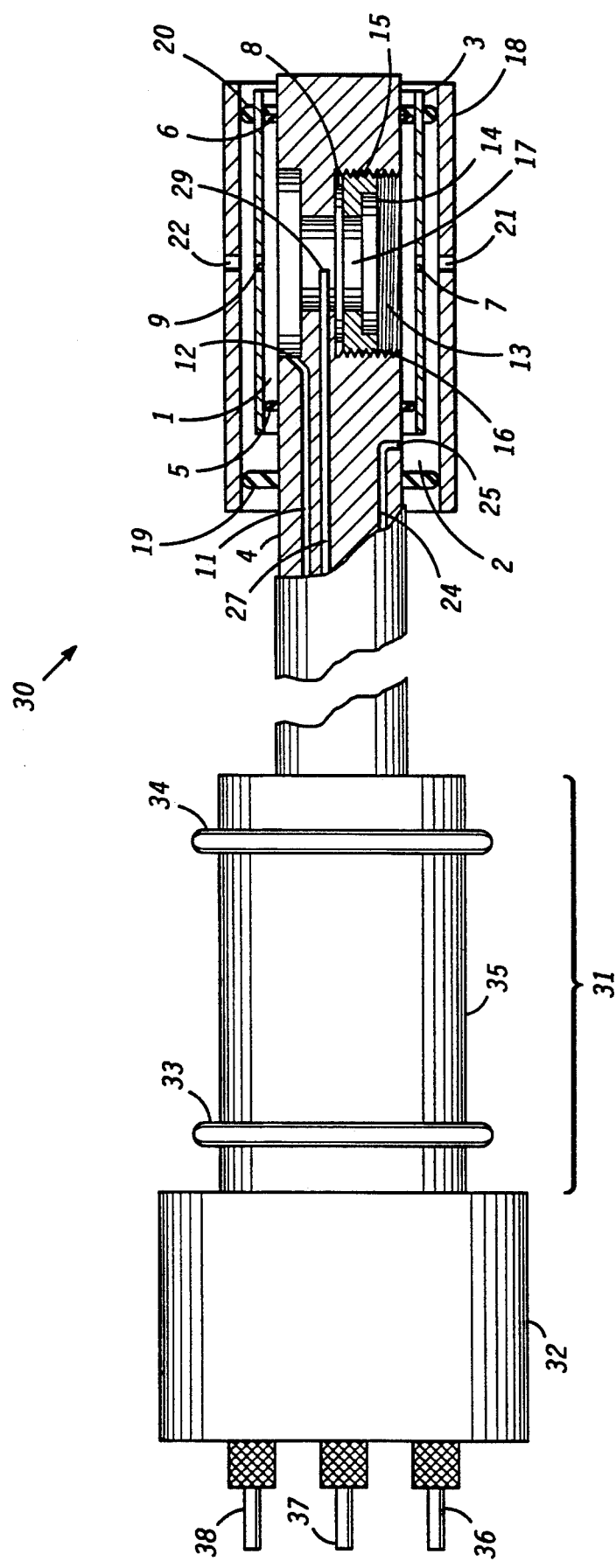
FIG. 1 shows a cross-section view of an environmental specimen holder for a transmission electron microscope as a preferred embodiment in accordance with the present invention.

FIG. 1 shows a cross-section view of an environmental specimen holder 26 for a transmission electron microscope as a preferred embodiment in accordance with the present invention. A TEM specimen 8 is held inside a differential chamber 1. TEM specimen 8 is typically a slice of material approximately 3 millimeters in diameter. TEM specimen 8 sits in a recess 13 which has been cut into a specimen holder shaft 4. TEM specimen 8 is held in place by a threaded locknut 14, having a thread 15 which meets with matching threads 16 cut on the inside of recess 13. A circular hole 17 is machined through the middle of locknut 14. Circular hole 17 enables the TEM electron beam to pass through TEM specimen 8.

The preferred embodiment includes two nested differential vacuum chambers, differential chamber 1, and a differential chamber 2. Differential chamber 1 is formed by a removable sleeve 3 separated from a specimen holder shaft 4 by two O-rings 5 and 6. O-rings 5 and 6 help form a vacuum seal between removable sleeve 3 and holder shaft 4. An aperture 7 is machined at the top side of removable sleeve 3 which permits the electron beam to enter differential chamber 1 and impinge on TEM specimen 8. A second aperture 9 is present on the opposing side of removable sleeve 3. Second aperture 9 permits the electron beam that has passed through specimen 8 to travel past removable sleeve 3 and down the TEM column. The TEM senses this beam and forms a TEM image of the specimen. Differential chamber 1 is evacuated by use of an external vacuum pump attached to a vacuum line 11. Vacuum line 11 is coupled to differential chamber 1 by an inlet 12.

Differential chamber 2 is constructed outside differential chamber 1. Differential chamber 2 completely encloses differential chamber 1. Differential chamber 2 is formed by a removable sleeve 18 separated from specimen holder shaft 4 by an O-ring 19 at one end and separated from removable sleeve 3 by a second O-ring 20 at the other end. O-rings 19 and 20 help form a vacuum seal between removable sleeve 18 on one hand and removable sleeve 3 on the other, or between removable sleeve 18 and specimen holder shaft 4 at the other end. An entry aperture 21 is formed at the top of removable sleeve 18 and aligned with aperture 7. This allows the electron beam to pass through differential chamber 2, enter differential chamber 1 and impinge on TEM specimen 8. An exit aperture 22 is formed at the bottom of removable sleeve 18, permitting the electron beam to exit from differential chamber 2. In the preferred embodiment apertures 21, 22, 9, and 7 are between 50–100 micrometers in diameter. Differential chamber 2 is exhausted by use of a second external pump which is attached to a vacuum line 24. Vacuum line 24 is attached to differential chamber 2 by a vacuum inlet 25.

A reactive material inlet 29 allows a reactive gas or liquid to be introduced into specimen holder 26 and hence onto TEM specimen 8. A chemical reaction can then occur between the material which makes up TEM specimen 8 and the reactive gas or liquid. TEM analysis can thus be performed using the TEM electron beam while the reaction is proceeding. Reactive material inlet 29 comprises an inlet line 27 attached to a reactor fluid source. The reactor fluid source is typically a source of the reactive gas or liquid such as a pressure bottle or liquid container. The end of reactive material inlet line 29 is directly above TEM specimen 8 so the liquid or gas is introduced to the surface of TEM specimen 8 by gravity.

A specimen holder head 30 is attached to a specimen holder thorax 31 which in turn is attached to a specimen holder base 32. During operation of the TEM, specimen holder head 30 is inserted entirely into the vacuum chamber of the TEM column. Specimen holder thorax 31 sits in a shaft in the side of the TEM. Two O-rings, 33 and 34, are used on the shaft of specimen holder thorax 31 to provide a vacuum seal between specimen holder thorax 31 and the walls of the opening in the side of the TEM. This allows the vacuum to be maintained within the TEM. Three connectors, connectors 36, 37, and 38 are fixed on the backside of specimen holder base 32. Connector 37 provides a connection between reactive fluid inlet line 27 and the reactor fluid source. Connector 38 provides a connection between differential chamber 1 and the external vacuum pump. Likewise connector 36 provides a connection between differential chamber 2 and the second external vacuum pump. An alternative embodiment in accordance with the present invention uses a single differential chamber 1 for less demanding studies. Another embodiment uses a plurality of nested chambers added in the fashion of differential chamber 2 to operate with a better vacuum within the TEM column or to allow a higher reaction gas pressure at the surface of TEM sample 8. Yet another embodiment uses thin windows to cover apertures 7, 9, 21, and 22. These thin windows may be fabricated from a material such as carbon film, Kevlar, or diamond. Alternatively another material having a low atomic number such as beryllium or lithium could be used to construct the windows. These windows serve to permit a higher pressure of reactive gas at the surface of TEM specimen 8 while still allowing a good vacuum in the TEM column. Typically the vacuum within the TEM column is maintained at approximately $10^{-6}$ torr.

By now it should be clear that the present invention provides a specimen holder for a transmission electron microscope which will permit the study of chemical reactions involving gases and liquids interacting with the specimen. This holder allows a relatively dense atmosphere close to the specimen and yet maintains a good enough vacuum that the electron beam can be focused to obtain high resolution. The specimen holder is compatible with current transmission electron microscope equipment, and allows modification of the holder or adjustment of the specimen without disassembling the entire transmission electron microscope.

What is claimed is:

1. An environmental chamber for a transmission electron microscope, comprising:
   a transmission electron microscope having a specimen holder;
   a specimen held in a predetermined position within the transmission electron microscope such that an electron beam is directed through the specimen to a detector;
   a first removable sleeve which surrounds the specimen holder;
   a first end seal at a first end of the first removable sleeve which forms a seal between the first removable sleeve and the specimen holder;
   a second end seal at an end opposing the first end of the first removable sleeve, the second end seal forming a seal between the first removable sleeve to the specimen holder in such a way as to form a first differential chamber;
   a first aperture formed in the first removable sleeve such that the electron beam is allowed to pass through the first aperture to impinge upon a predetermined portion of the specimen;
   a second aperture formed in the first removable sleeve such that the electron beam passes through the specimen then through the second aperture to impinge upon the detector;
   a first vacuum line which allows material to be removed from the first differential chamber; and
   a reactive inlet line extending into the first differential chamber in such a way as to allow a desired material to be introduced onto the specimen.

2. The environmental chamber for a transmission electron microscope of claim 1 further comprising:
   a second removable sleeve which surrounds both the specimen holder and the first removable sleeve;
   a third end seal at a first end of the second removable sleeve which forms a seal between the second removable sleeve and the specimen holder;
   a fourth end seal at an end opposing the second end of the second removable sleeve, the fourth end seal forming a seal between the second removable sleeve to the specimen holder in such a way as to form a second differential chamber which encloses the first removable sleeve and the first differential chamber;
   a third aperture formed in the second removable sleeve such that the electron beam passes through the third aperture to impinge upon a predetermined portion of the specimen;
   a fourth aperture formed in the second removable sleeve such that the electron beam passes through the fourth aperture after passing through the specimen to impinge upon the detector; and
   a second vacuum line which allows gases to be removed from the second differential chamber.

3. The environmental chamber for a transmission electron microscope of claim 1 further comprising:
a plurality of nested removable sleeves which surround the specimen holder and the first removable sleeve;
a plurality of end seals arranged at opposing ends of each removable sleeve which forms a seal between the removable sleeve and the specimen holder in such a way as to form an added differential chamber which encloses all of the previous nested removable sleeves and the previous differential chambers;
an ingress aperture formed in each removable sleeve such that the electron beam passes through the ingress aperture to impinge upon a predetermined portion of the specimen;
an egress aperture formed in each removable sleeve such that the electron beam passes through the egress aperture after passing through the specimen; and
a plurality of vacuum lines, one for each differential chamber, which allows gases to be removed from each differential chamber.

4. The environmental chamber for a transmission electron microscope of claim 1 further comprising:
a plurality of reactive inlet lines extending into the first differential chamber in such a way as to allow each reactive inlet line to introduce a different, desired material onto the specimen, the reactive inlet lines all being located at a predetermined distance from the first vacuum line such that material which escapes from the specimen into the first differential chamber is substantially removed by the first vacuum line.

5. The environmental chamber for a transmission electron microscope of claim 1 further comprising:
a first thin window which fills the first aperture such that gaseous material is blocked but the electron beam is substantially undisturbed; and
a second thin window which fills the second aperture such that gaseous material is blocked but the electron beam is substantially undisturbed.

6. The environmental chamber for a transmission electron microscope of claim 5 wherein the first thin window and the second thin window comprise a thin film of a carbon material.

7. The environmental chamber for a transmission electron microscope of claim 5 wherein the first thin window and the second thin window comprise a Kevlar material.

8. An environmental chamber for a transmission electron microscope, comprising:
a transmission electron microscope having a specimen holder, the specimen holder having a shaft which extends into an electron beam;
a specimen held in a predetermined position by the specimen holder within the transmission electron microscope such that an electron beam is directed through the specimen to a detector;
a first removable sleeve which surrounds the shaft of the specimen holder;
a first end seal at a first end of the first removable sleeve which forms a seal between the first removable sleeve to the specimen holder;
a second end seal at an end opposing the first end of the first removable sleeve, the second end seal forming a seal between the first removable sleeve to the specimen holder in such a way as to form a first differential chamber;
a first aperture formed in the first removable sleeve such that the electron beam passes through the first aperture to impinge upon a predetermined portion of the specimen;
a second aperture formed in the first removable sleeve such that the electron beam passes through the second aperture after passing through the specimen to impinge upon the detector;
a first thin window fabricated from a thin film of carbon material which fills the first aperture such that gaseous material is blocked but the electron beam is substantially undisturbed;
a second thin window fabricated from a thin film of carbon material which fills the second aperture such that gaseous material is blocked but the electron beam is substantially undisturbed;
a first vacuum line which allows gases to be removed from the first differential chamber;
a second removable sleeve which surrounds both the shaft of the specimen holder and the first removable sleeve;
a third end seal at a first end of the second removable sleeve which forms a seal between the second removable sleeve to the specimen holder;
a fourth end seal at an end opposing the first end of the second removable sleeve, the fourth end seal forming a seal between the second removable sleeve to the specimen holder in such a way as to form a second differential chamber which encloses the first removable sleeve and the first differential chamber;
a third aperture formed in the second removable sleeve such that the electron beam passes through the third aperture to impinge upon a predetermined portion of the specimen;
a fourth aperture formed in the second removable sleeve such that the electron beam passes through the fourth aperture after passing through the specimen to impinge upon the detector;
a third thin window fabricated from a thin film of carbon material which fills the third aperture such that gaseous material is blocked but the electron beam is substantially undisturbed;
a fourth thin window fabricated from a thin film of carbon material which fills the fourth aperture such that gaseous material is blocked but the electron beam is substantially undisturbed;
a second vacuum line which allows gases to be removed from the second differential chamber; and
a reactive inlet line extending into the first differential chamber in such a way as to allow a desired material to be introduced onto the specimen, the reactive inlet line being located at a predetermined distance from the first vacuum line such that material which escapes from the specimen into the differential chamber is substantially removed by the first vacuum line.

9. A method for fabricating an environmental chamber for a transmission electron microscope, comprising:
providing a transmission electron microscope having a removable specimen holder;
holding a specimen in a predetermined position within the transmission electron microscope such that an electron beam is directed through the specimen to a detector;

surrounding the specimen holder with a first removable sleeve;

sealing both ends of the first removable sleeve to the specimen holder by means of a plurality of O-rings in such a way as to form a differential chamber;

forming two apertures in the first removable sleeve such that the electron beam passes through the two apertures;

filling the two apertures with a thin film of carbon material such that passage of gaseous material is blocked but passage of the electron beam is substantially undisturbed;

evacuating gases from the first differential chamber with a first vacuum line; and introducing material onto the specimen by a reactive inlet line which extends into the first differential chamber.

* * * * *